(12) United States Patent
Frahnow et al.

(10) Patent No.: US 7,874,219 B2
(45) Date of Patent: Jan. 25, 2011

(54) MICROMECHANICAL SENSOR FOR MEASURING THE MASS FLOW RATE IN ACCORDANCE WITH THE CORIOLIS PRINCIPLE

(75) Inventors: Roman Frahnow, Berlin (DE); Arno Steckenborn, Berlin (DE)

(73) Assignee: Siemens Aktiengesellschaft, Munich (DE)

( * ) Notice: Subject to any disclaimer, the term of this patent is extended or adjusted under 35 U.S.C. 154(b) by 154 days.

(21) Appl. No.: 12/306,012

(22) PCT Filed: Jun. 15, 2007

(86) PCT No.: PCT/EP2007/055946
§ 371 (c)(1),
(2), (4) Date: Dec. 22, 2008

(87) PCT Pub. No.: WO2007/147786
PCT Pub. Date: Dec. 27, 2007

(65) Prior Publication Data
US 2009/0272200 A1  Nov. 5, 2009

(30) Foreign Application Priority Data
Jun. 21, 2006  (DE) .................. 10 2006 029 443

(51) Int. Cl.
*G01F 1/84* (2006.01)
(52) U.S. Cl. .................. 73/861.355
(58) Field of Classification Search .......... None
See application file for complete search history.

(56) References Cited
U.S. PATENT DOCUMENTS

| | | | | |
|---|---|---|---|---|
| 4,491,025 A * | 1/1985 | Smith et al. | ............ | 73/861.355 |
| 4,653,332 A | 3/1987 | Simonsen | ................ | 73/861.38 |
| 4,768,385 A | 9/1988 | Cage | ................ | 73/861.38 |
| 5,959,206 A * | 9/1999 | Ryrko et al. | ............. | 73/504.12 |
| 5,969,264 A * | 10/1999 | Rivkin | ................ | 73/861.356 |
| 6,044,705 A * | 4/2000 | Neukermans et al. | ..... | 73/504.02 |
| 6,474,162 B1 * | 11/2002 | Voss et al. | ................ | 73/504.16 |
| 6,477,901 B1 * | 11/2002 | Tadigadapa et al. | ..... | 73/861.352 |

(Continued)

FOREIGN PATENT DOCUMENTS

DE  34 43 234 A1  6/1986

OTHER PUBLICATIONS

Enoksson et al., "Fluid Density Sensor Based on Resonance Vibration", Sensors and Actuators A 46-47, pp. 327-331, 1995.

(Continued)

*Primary Examiner*—Harshad Patel
(74) *Attorney, Agent, or Firm*—King & Spalding L.L.P.

(57) ABSTRACT

In a micromechanical sensor (11) for measuring a mass flow rate in accordance with the Coriolis principle, two line sections (13) are mounted in a suspension means (24) such that they can oscillate, as a result of which they can be caused to oscillate in phase opposition (essential for the measuring principle). A spacer layer (18) is provided between the layers (12a, 12b) forming the line sections (13), the spacer layer ensuring that there is a space between the line sections (13) in the quiescent state. Oscillation of the line sections in phase opposition only becomes possible at all as a result of this since this prevents collision of the line sections (13) as they approach one another.

20 Claims, 4 Drawing Sheets

U.S. PATENT DOCUMENTS

| | | | |
|---|---|---|---|
| 6,647,778 B2 | 11/2003 | Sparks | 73/204.26 |
| 6,722,209 B1 | 4/2004 | Fan et al. | 73/861.355 |
| 6,935,010 B2 | 8/2005 | Tadigadapa et al. | 29/592.1 |
| 7,059,176 B2 | 6/2006 | Sparks | 73/54.41 |
| 7,434,457 B2 * | 10/2008 | Goodwin et al. | 73/152.46 |
| 7,568,399 B2 * | 8/2009 | Sparks et al. | 73/861.355 |
| 2006/0196253 A1 * | 9/2006 | Crawley et al. | 73/53.01 |
| 2009/0064781 A1 * | 3/2009 | Ayazi et al. | 73/504.12 |
| 2009/0308177 A1 * | 12/2009 | Lammerink et al. | 73/861.355 |
| 2010/0037690 A1 * | 2/2010 | Gunthner et al. | 73/504.04 |

OTHER PUBLICATIONS

Nguyen et al., "Mikromechanische Strömungssensoren im Überblick", Carl Hanser Verlag, München, 5 pages, 1996.

Enoksson et al., "A Silicon Resonant Sensor Structure for Coriolis Mass-Flow Measurements", Journal of Microelectromechanical Systems, vol. 6, No. 2, pp. 119-125, Jun. 1997.

Zhang et al., "A Micromachined Coriolis-Force-Based Mass Flowmeter for Direct Mass Flow and Fluid Density Measurement", XP-002451415, The 11th International Conference on Solid-State Sensors and Actuators, Munich, Germany, 4 pages, Jun. 10-14, 2001.

* cited by examiner

MICROMECHANICAL SENSOR FOR MEASURING THE MASS FLOW RATE IN ACCORDANCE WITH THE CORIOLIS PRINCIPLE

CROSS-REFERENCE TO RELATED APPLICATIONS

This application is a U.S. National Stage Application of International Application No. PCT/EP2007/055946 filed Jun. 15, 2007, which designates the United States of America, and claims priority to German Application No. 10 2006 029 443.2 filed Jun. 21, 2006, the contents of which are hereby incorporated by reference in their entirety.

TECHNICAL FIELD

The invention relates to a sensor of micromechanical design for measuring the mass flow rate in accordance with the Coriolis principle, having two line sections mounted in oscillatory fashion for the fluid whose mass flow rate is to be measured, the line sections together with the oscillatory mounting being formed by stacked structured layers.

BACKGROUND

Sensors for measuring the mass flow rate which operate in accordance with the Coriolis principle are already known in various designs from the prior art, these generally being embodied in a conventional design, that is to say not in a micromechanical design. U.S. Pat. No. 4,768,385 discloses such a sensor, for example, two line sections being provided which extend in two planes running parallel to one another. These two line sections can be excited to effect oscillations in antiphase, an electrical measuring device for measuring the oscillation behavior being provided at the location of the greatest deflection. The measurement principle is based on the so-called Coriolis principle. This exploits the physical effect that fluids which are flowing, that is to say which are in motion, assuming that they are conducted through a rotating or oscillating fluid conductor, generate Coriolis forces that act at right angles to the flow direction of the fluid, on the one hand, and to the direction of movement of the fluid conductor, on the other hand. The magnitude of said Coriolis forces is proportional to the product of the mass flow and the angular velocity of the fluid. By measuring the Coriolis force, with a known geometry of the fluid conductor it is thus possible to calculate the mass flow of the fluid.

DE 34 43 234 A1 describes a mass flow rate sensor in accordance with the Coriolis principle which has a different design. In this sensor, the line sections used for measurement have a rectilinear course and are arranged parallel to one another. In order to carry out the measurement, the line sections are caused to effect bending oscillations.

Enoksson et al. in "A Silicon Resonant sensor structure for Coriolis mass flow managements", Journal of Micro electro Mechanical Systems, Vol. 6, No. 2, June 1997, make a proposal as to how mass flow sensors in accordance with the Coriolis principle can be embodied in a micromechanical design. The micromechanically produced sensor is produced from two bonded silicon wafers into which half-shells of the line sections to be produced have respectively being produced. The half-shells are completed to form a closed line cross section. Owing to the outlay associated with the anisotropic etching of silicon wafers, the mass flow rate sensor is produced only in two layers. For this purpose, two line sections are produced which lie in one plane in accordance with the geometrical extent of the wafers. The two line sections can be excited to effect oscillations in different oscillation modes, it being apparent that different sensor quality factors can be achieved depending on the chosen type of excitation. The sensor quality factor (Q) is a measure of the damping of the oscillatory system which directly influences the sensitivity of the relevant sensor structure. Quality factors of $Q<=1500$ can be achieved with the mass flow rate sensors of micromechanical design as proposed by Enoksson.

SUMMARY

According to various embodiments, a mass flow rate senor can be specified in accordance with the Coriolis principle of micromechanical design which has an improved sensitivity.

According to an embodiment, a sensor of micromechanical design for measuring the mass flow rate in accordance with the Coriolis principle, may comprise two line sections mounted in oscillatory fashion for a fluid whose mass flow rate is to be measured, the line sections together with an oscillatory mounting being formed by stacked structured layers, wherein the line sections are embodied mirror-symmetrically with respect to a plane of symmetry and extend in two mutually parallel planes with in each case the same spacing with respect to the plane of symmetry, the spacing being dimensioned taking account of the oscillation amplitudes provided for the line sections and being predetermined by at least one spacer structure embodied in the structured layers.

According to a further embodiment, the line sections can be formed by in each case two stacked line layers in whose connecting area the line cross section lies. According to a further embodiment, the spacer structure can be formed by a depression in at least one of the line layers, preferably by symmetrical depressions in both line layers, the line layers being connected to one another by the side remote from the connecting area. According to a further embodiment, the spacer structure can be formed by a spacer layer, the layers that form the line section being fitted on the opposite sides of the spacer layer whilst forming the spacing. According to a further embodiment, the line sections may have a looped course and the ends of a respective line section may run together in a common bearing location. According to a further embodiment, in the common bearing location, perpendicular to the plane of symmetry, there is a further plane of symmetry, relative to which two further line sections can be mounted in the common bearing location symmetrically with respect to the line sections. According to a further embodiment, the line sections may run in straight fashion and can be mounted with their ends in each case in two opposite bearing locations. According to a further embodiment, the bearing locations may comprise tube-like extensions of the line sections which are clamped essentially rigidly at their ends and deform elastically if the line sections are caused to effect oscillations. According to a further embodiment, the line sections may merge into the tube-like extensions and the extensions can be embodied in straight fashion and clamped rigidly with their ends in opposite structures. According to a further embodiment, the line sections may be surrounded by a hermetic encapsulation.

BRIEF DESCRIPTION OF THE DRAWINGS

Further details of the invention are described below with reference to the drawing. Identical or mutually corresponding drawing elements are provided with the same reference symbols in each case in the individual figures and are explained repeatedly only insofar as there are differences evident between the individual figures. In the figures.

DETAILED DESCRIPTION

According to various embodiments, with the sensor specified in the introduction, by virtue of the fact that the line sections are embodied mirror-symmetrically with respect to a plane of symmetry and extend in two mutually parallel planes with in each case the same spacing a with respect to the plane of symmetry, the spacing a being dimensioned taking account of the oscillation amplitudes provided for the line sections and being predetermined by at least one spacer structure embodied in the structured layers. By means of the sensor construction according to an embodiment, a design such as is customary in a conventional design as described in the introduction can advantageously be produced in a micromechanical design as well. In this case it was necessary to solve the problem that the oscillation amplitude of the oscillating line sections has to be taken into account in the case where the line sections are arranged in two parallel planes. This is ensured by means of the spacer structure, which ensures a defined spacing a between the line sections, where the oscillation amplitudes of the line sections that are to be generated in a system-governed manner have to be taken into account in this case.

The spacer structure is integrated into the micromechanical construction in the form of different layers, thereby facilitating production in a micromechanical design. By virtue of the symmetries that occur in the layer-by-layer construction of the sensor, identical parts can be used for the two line sections, such that the manufacturing outlay for the micromechanical sensor according to an embodiment can be kept within limits despite provision of more than two layers.

The arrangement of the line sections in two planes makes possible, as will be explained in more detail below, excitation modes which result in a significantly lower damping of the oscillatory systems. The quality factor and thus also the sensitivity of the micromechanical sensor can advantageously be significantly improved as a result of this.

One configuration of the various embodiments provides for the line sections to be formed by in each case two stacked line layers in whose connecting area the line cross section lies. This embodiment has the advantage that the line sections can be produced with recourse to proven methods as described by Enoksson, for example. One particular configuration according to an embodiment provides for the spacer structure to be formed by a depression in at least one of the line layers, preferably by symmetrical depressions in both line layers, the line layers being connected to one another by the side remote from the connecting area. This advantageously makes it possible for the elements required for the spacer structure to be integrated into the layers of the sensor construction which have to be provided anyway for producing the line sections. The additional structural outlay of a further layer can thus be saved. The design outlined is therefore advantageous particularly when the production of the layers is realized in terms of primary forming technology using plastic, for example, since the more complex geometry on account of the integrated spacer structure does not mean additional outlay during production. On the other hand, however, the increased assembly outlay associated with providing an additional layer can be saved.

An alternative configuration, according to an embodiment, can also provide, however, for the spacer structure to be formed by a spacer layer, the layers that form the line section being fitted on the opposite sides of the spacer layer whilst forming the spacing a. This construction necessitates an additional layer in the sensor, such a construction being advantageous particularly when the layers that form the line sections are produced using etching technology. This is because the geometry of said layers is not made unnecessarily more complex as a result of this, such that an efficient method implementation during the etching treatment of the silicon wafers is possible. The simple geometry of the layers forming the line sections furthermore enables these layers to be standardized, such that the sensor structure, in particular in the case of a symmetrical construction, can be composed of layers configured identically in each case.

Furthermore, it is possible to use for the spacer layer a comparatively favorably produced standard component which can be combined intimately with the silicon layers. This is because the requirements made of the dimensional accuracy of the spacer layer are significantly less stringent than the requirements made of the geometry of the layers that form the line sections. In the case of the spacer layer, all that is required is a defined thickness in the regions which are fixed to the adjacent layers.

One particular configuration, according to an embodiment, provides for the line sections to have a looped course and the ends of a respective line section to run together in a common bearing location. This produces an oscillatory system which can advantageously experience a large deflection in the case of small excitation forces since the configuration of the line sections which is comparable with a floating mounting leads to low stiffness of the suspension.

Furthermore, it is advantageous if in the common bearing location, perpendicular to the plane of symmetry, there is a further plane of symmetry, relative to which two further line sections are mounted in the common bearing location symmetrically with respect to the line sections. This results in a configurational refinement with four line sections which can be brought together in one large common bearing location. In this case, the bearing forces that occur, in the case of suitable excitation, can advantageously be substantially compensated for, whereby the damping of the system can be reduced. The higher quality factor resulting from this advantageously leads to a further increase in the sensitivity of the sensor.

Another configuration, according to an embodiment, is obtained if the line sections run in straight fashion and are mounted with their ends in each case in two opposite bearing locations. A sensor embodied in this way is excited in such a way that the line sections perform bending oscillations. The higher sensor stiffness associated with this is advantageous particularly when fluids having a high density, in particular liquids, are intended to be assessed with regard to their mass flow rate.

A particular configuration arises for the bearing locations if the latter comprise tube-like extensions of the line sections which are clamped essentially rigidly at their ends and deform elastically if the line sections are caused to effect oscillations. The tube-like extensions firstly advantageously ensure that the flowing fluid is fed into and discharged from the line sections in a simple manner. Furthermore, the structuring of the extensions can be oriented such that the latter substantially undertake the resilience in the spring-mass system to be assessed. As a result of separating the tasks (the line section with the fluid situated therein then serves as mass), the behavior of the sensor can be better predicted as early as during construction. A particular configuration is obtained if the line sections merge into the tube-like extensions and the extensions are embodied in straight fashion and clamped rigidly with their ends in opposite structures. The interface between the line sections and the extensions is embodied as a merging junction when the line section branches in T-shaped fashion as it were in the extensions. This affords the possibility that the extensions ca n be clamped symmetrically, torsion springs being formed in each case between the merging location of the line section and the clamping location at the ends of the extensions. This benefits the fashioning of the extensions as a tubular structure, whereby readily definable oscillations can be generated.

Finally, it is advantageous if the line sections are surrounded by a hermetic encapsulation. The latter advantageously constitutes a protection of the sensitive sensor structure from the surroundings. Furthermore, an encapsulation can advantageously be used to lower the pressure inside the encapsulation with respect to the surroundings, in particular to produce a vacuum in the hermetic encapsulation, whereby the air friction associated with the oscillations of the line sections can be reduced. This measure brings about an additional reduction the damping, whereby the sensitivity of the sensor can advantageously be improved further.

Figure 1:
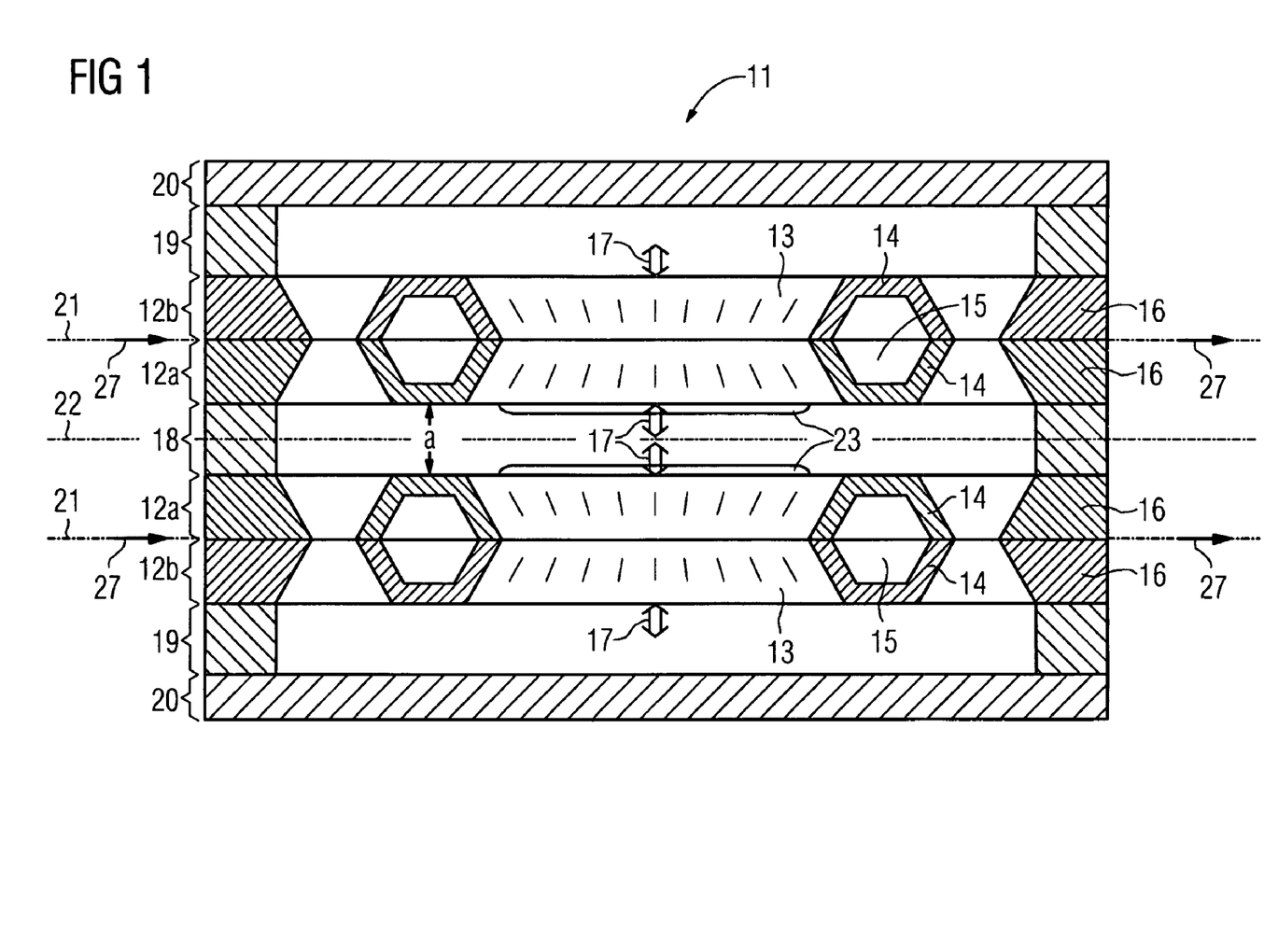
FIG. 1 shows a schematic cross section through an exemplary embodiment of the sensor, which is additionally provided with a hermetic encapsulation.

FIG. 1 illustrates a micromechanically produced mass flow rate sensor 11 comprising a total of nine micromechanically produced layers. Line layers 12a, 12b constitute the essential core, said line layers contributing to the formation of line sections 13. In this case, a line layer 12a and a line layer 12b respectively form half-shells 14 which, after the bonding of the layers, become closed line cross sections 15. The latter are connected to the frame structure 16 in a manner not illustrated, whereby the suspension of the line sections 13 is effected (more details on this below).

In the event of oscillation excitation, the line sections 13 perform oscillations, indicated by parts 17. In order that the line sections, which are excited in antiphase in order to generate a highest possible quality factor, do not impede one another when forming the oscillations, a spacer layer 18 is provided between the line layers 12a, the thickness of said spacer layer guaranteeing a defined spacing a between the line layers. In this case, the spacer layer is connected to the frame structures 16 of the line layer 12a.

In order to realize a hermetic encapsulation of the line sections 13, the line layers 12b are in each case provided with further spacer layers 19 toward the outside, said further spacer layers being supported in the same way on the frame structure 16 of the line layers 12b. Covering layers 20 are provided on the other side of said spacer layers 19, a closure of the system being possible with said covering layers. In this case, the further spacer layers 19 fulfill the same function as the spacer layer 17 already mentioned, which consists in the line sections 13 not bouncing against the covering layers 20 while they perform their oscillations.

The line layers 12a, 12b are produced from silicon wafers by means of anisotropic etching. This explains the hexagonal line cross section 15. The line layers 12a, 12b are embodied as identical parts on account of the symmetry, such that these identical parts can be produced in comparatively large numbers. They are provided on the surface of a wafer and separated after the etching treatment. The further layers 18, 19, 20 can likewise be manufactured from silicon. In the same way as the respective layers 12a and 12b, they can then be connected to one another by wafer bonding. As an alternative, however, the further layers can also be manufactured from a more cost-effective material since components having a comparatively simple geometry are involved. In this case, the further layers would have to be adhesively bonded to the line layers 12a, 12b, for example.

The line sections 13 extend in each case in two planes 21 parallel to one another, whereby the constant spacing a is ensured. The two line sections 13 are furthermore embodied mirror-symmetrically with respect to a plane 22 of symmetry. The bearings (not illustrated) are likewise symmetrical with respect to one another, such that the system can be caused to effect oscillations in antiphase by means of suitable excitation, so as to carry out the oscillations indicated by the arrows 17. Oscillation excitation can be effected for example by means of the electrically conductive coating 23 on the line sections, which form a capacitor and induce oscillation movements in the line sections by means of suitable electrical driving (in a manner not illustrated). A corresponding embodiment of electrodes, which is not illustrated in more detail in FIG. 1, can likewise be used for the electrical readout of the oscillation behavior (amplitude, frequency), this electrical signal being evaluated as sensor signal.

Figure 2:
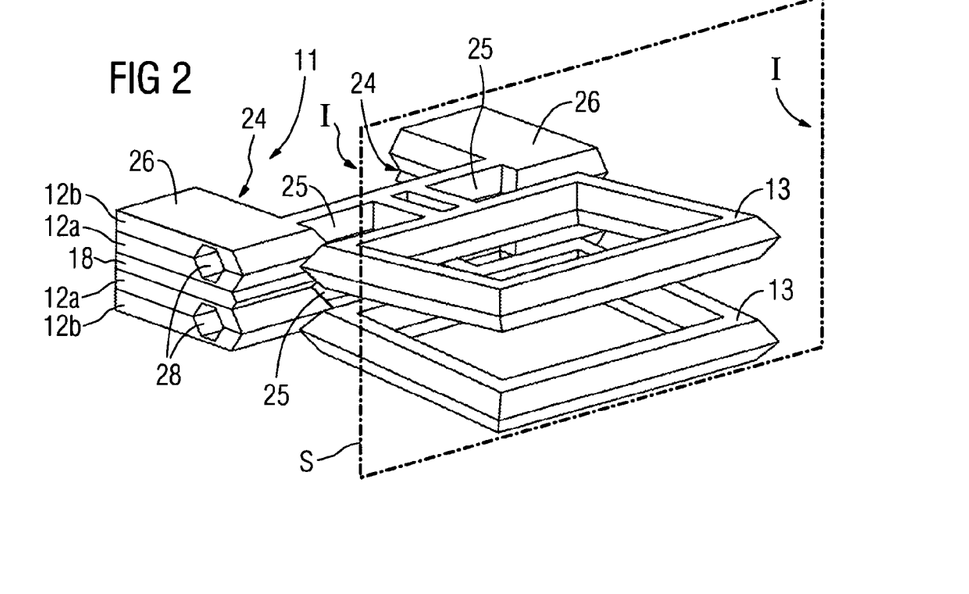
FIG. 2 shows a perspective view of the line sections and of the suspension of the sensor in accordance with FIG. 1.

FIG. 2 illustrates the sensor structure in accordance with FIG. 1 in perspective view. The sectional plane S is indicated in FIG. 2, the two line sections 13 being illustrated in the deflected state in FIG. 2, in contrast to FIG. 1. The layers 19 and 20 illustrated in FIG. 1 and also the frame structures of the remaining layers are not illustrated in FIG. 2. However, in addition to the line sections 13, the bearing locations 24 also become clear from FIG. 2, said bearing locations comprising firstly in each case extensions 25 of the line sections 13 and rigid clamping arrangements 26 forming the interface with respect to the frame structures 16 (not illustrated) (cf. FIG. 1).

The line sections 13 merge into the extensions 25 in T-shaped fashion. Since the extensions 25 verge into the rigid clamping arrangements 26 at their respective ends, essentially a torsional stress is induced in the extensions by a deflection of the line sections 13 in the form illustrated in FIG. 2. The line sections 13 with their fluidic filling (gas or liquid) therefore serve as the mass and the extensions serve as the torsion spring of an oscillatory spring-mass system.

The extensions simultaneously serve for conducting the fluid into and out of the line structure. This is also indicated by arrows 27 in FIG. 1. The outlets 28 for the fluid can be discerned in FIG. 2, said outlets undergoing a corresponding extension toward the outside by the frame structures 16 (not illustrated). The corresponding inlets are provided on the opposite side (cannot be discerned in FIG. 2).

Figure 3:
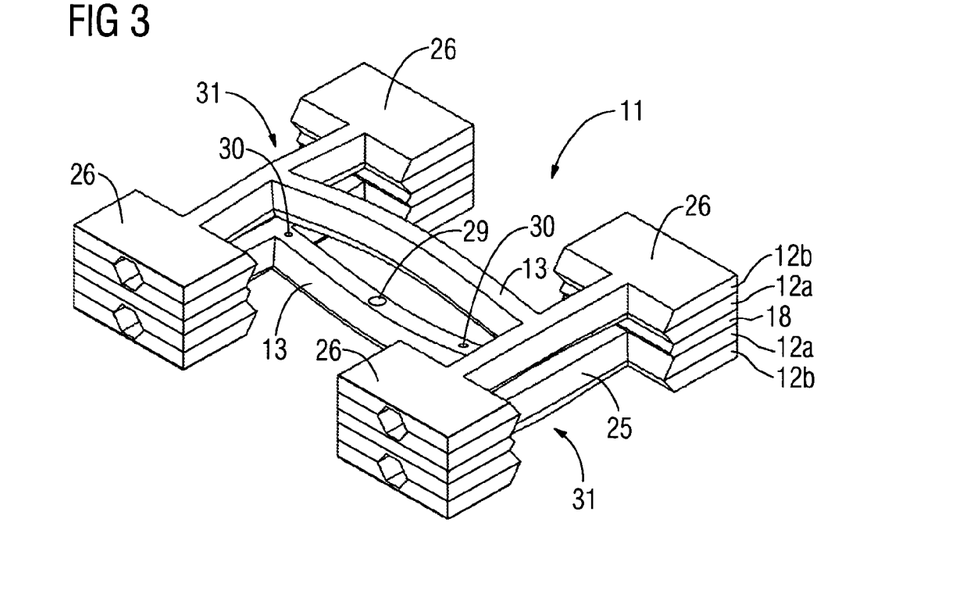
FIG. 3 shows the perspective view of another exemplary embodiment of the sensor, and FIG. 4 schematically shows the configuration of a sensor in accordance with FIG. 1 with four line sections arranged symmetrically and the mechanical loads resulting therefrom.

FIG. 3 illustrates an alternative embodiment of the sensor. The line sections 13 are led straight ahead, but they are illustrated in the deflected state of FIG. 3. On the lower line section, an excitation electrode 29 and two measuring electrodes 30 can furthermore be discerned, by means of which the system can be excited and its oscillation behavior can be detected.

The line sections are incorporated into respective extensions 25 at opposite ends, said extensions, for their part, merging into clamping arrangements 26. This produces bearing locations 31 which function analogously to the bearing locations in accordance with FIG. 2 as soon as bending oscillations are induced in the line sections 13. For the rest, the sensor arrangement in accordance with FIG. 3 can be constructed in an analogous manner to FIG. 1 in order to realize a hermetic encapsulation.

Figure 4:
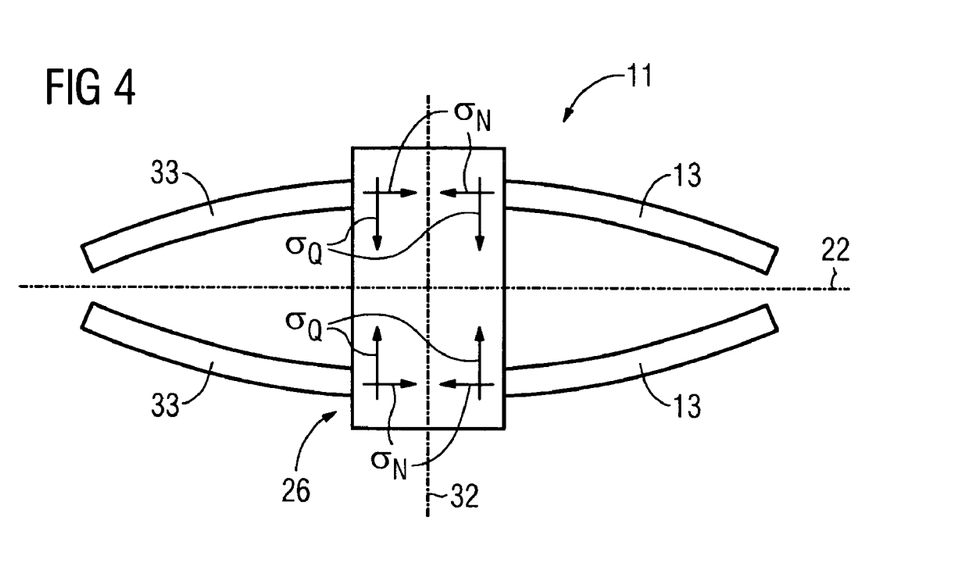

FIG. 4 schematically illustrates a construction for a sensor structure which can supplement a sensor structure in accordance with FIG. 2. The line sections 13 and also a central clamping arrangement 26 for both line sections 13 can be discerned. The line sections 13 are arranged symmetrically with respect to the plane 22 of symmetry.

Furthermore, a further plane 32 of symmetry is provided, which runs perpendicular to the plane 22 of symmetry centrally through the clamping arrangement 26. This plane of symmetry defines the symmetrical arrangement of two further line sections 33, which extend in an opposite direction to the line sections 13. The line sections can have a course corresponding to that illustrated in FIG. 2. This furthermore results, with regard to the course of the line sections 13 and 33, in a plane of symmetry which runs parallel to the plane of the drawing in accordance with FIG. 4 and in this respect runs parallel both on the plane 22 of symmetry and on the plane 32 of symmetry.

In the event of oscillation excitation in accordance with the manner indicated, the strict symmetrical relationships depicted between the line sections 13 and 33 bring about a force introduction into the clamping arrangement 26, which cancel one another out on account of the oscillation movements in antiphase inside the clamping arrangement. The illustration shows by way of example the normal stresses $\sigma_N$ and transverse stresses $\sigma_Q$ acting at the clamping locations of the line sections 13, 33. Said stresses are directed oppositely to the respectively adjacent line sections and are identical in magnitude on account of the symmetry and therefore cancel one another out within the rigid clamping arrangement. This advantageously has the effect that the stresses and resultant expansions are not passed on to the frame structures (not illustrated) and further surrounding components of the sensor. As a result of this, a loss of energy on account of deformations effected there can be kept small, whereby the damping of the oscillatory system decreases. This brings about an improvement of the sensor sensitivity in accordance with the manner already explained.

Figure 5:
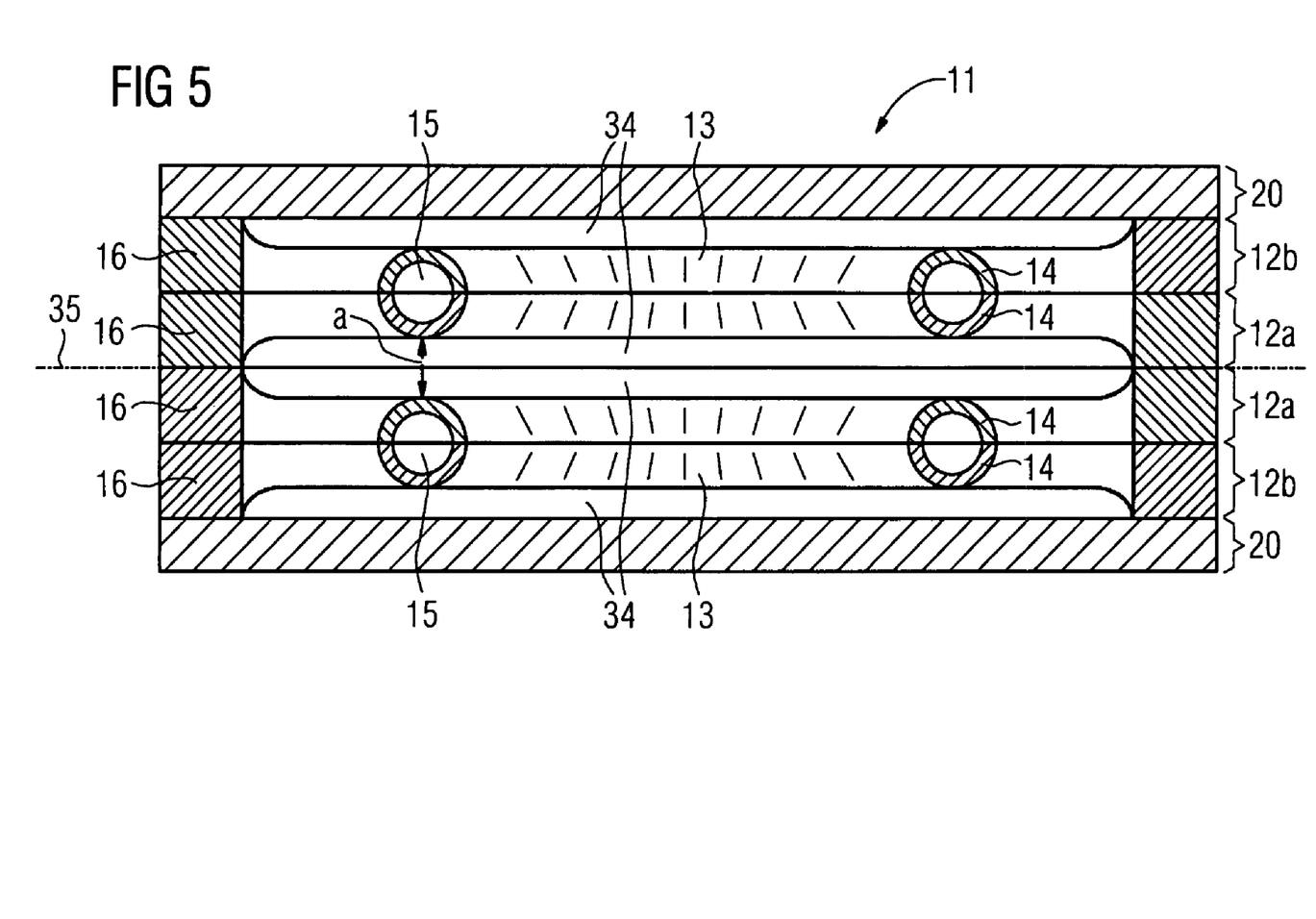
FIG. 5 shows a schematic cross section of an embodiment of the sensor formed from injection-molded plastic parts.

Finally, FIG. 5 illustrates a sensor structure which corresponds in its construction to that in accordance with FIG. 1, but was produced according to a different method. The line layers 12a, 12b are injection-molded parts composed of plastic which are adhesively bonded to one another, for example, after they have been manufactured. A particularly cost-effective component can be produced as a result of this. In particular, the assembly outlay for this sensor structure can be reduced since, in comparison with the design in FIG. 1, the spacer layers 18, 19 can be saved (instead, adhesive bonding of the line layers 12a with the sides 35 facing one another). This is because, by virtue of the production of the line layers 12a, 12b in terms of primary forming technology, the fashioning of depressions 34 in the layer can be realized in production, such that the diameter of the line sections 13 is smaller than the height of the frame structures 16. As a result of this, the spacing a becomes a structural parameter which is only dependent on the configuration of the line layers 12a, 12b and can therefore be produced without providing an additional spacer layer.

What is claimed is:

1. A sensor configured to measure a mass flow rate of a fluid in accordance with the Coriolis principle, the sensor comprising a micromechanical structure comprising:

a stack of micromechanical layers forming an enclosed frame and two line sections suspended within the enclosed frame in oscillatory fashion for the fluid, wherein at least one micromechanical layer in the stack forms both (a) a portion of the enclosed frame and (b) at least a portion of one of the two line sections suspended within the enclosed frame, wherein the line sections are embodied mirror-symmetrically with respect to a plane of symmetry and extend in two spaced apart parallel planes, respectively, wherein a spacing of the parallel planes is dimensioned taking account of oscillation amplitudes provided for the line sections, and wherein the spacing is predetermined by at least one spacer structure embodied in the structured layers.

2. The sensor according to claim 1, wherein the line sections are formed by two symmetrical stacked line layers, wherein each line layer has the form of a half shell.

3. The sensor according to claim 2, wherein the spacer structure is defined by a depression in at least one of the line layers reducing a thickness of at least one line section with respect to the respective line layer in which the line section is incorporated, wherein the spacer structures of the line layers are being connected to one another.

4. The sensor according to claim 2, wherein the spacer structure comprises symmetrical depressions in both line layers, the line layers being connected to one another by a side remote from a connecting area.

5. The sensor according to claim 1, wherein the spacer structure is formed by a spacer layer, wherein the stacked structured layers that form the line section are arranged on opposite sides of the spacer layer.

6. The sensor according to claim 1, wherein a first and second line section each comprises a looped course and ends of the first and second line sections are arranged in respective common bearing locations.

7. The sensor according to claim 6, wherein in the common bearing location, perpendicular to the plane of symmetry, there is a further plane of symmetry, relative to which third and fourth line sections are mounted in the common bearing location symmetrically with respect to the first and second line sections.

8. The sensor according to claim 6, wherein the common bearing locations comprise tube-shaped extensions connected to the line sections which are clamped essentially rigidly at their ends and deform elastically if the line sections are caused to effect oscillations.

9. The sensor according to claim 8, wherein the line sections merge into the tube-shaped extensions and the extensions are embodied in straight fashion and clamped rigidly with their ends in opposite structures.

10. The sensor according to claim 1, wherein the line sections comprise first and second ends, the line sections run in straight fashion and the first and second ends are mounted in two opposite bearing locations, respectively.

11. The sensor according to claim 1, wherein the line sections are surrounded by a hermetic encapsulation.

12. A method for measuring the mass flow rate in accordance with the Coriolis principle, comprising the steps of:

providing a stack of micromechanical layers forming an enclosed frame and two line sections suspended within the enclosed frame in oscillatory fashion for a fluid whose mass flow rate is to be measured, wherein at least one micromechanical layer in the stack forms both (a) a portion of the enclosed frame and (b) at least a portion of one of the two line sections suspended within the enclosed frame, embodying the line sections mirror-symmetrically with respect to a plane of symmetry and extending the line sections in two spaced apart parallel planes, wherein a spacing being dimensioned taking account of oscillation amplitudes provided for the line sections and being predetermined by at least one spacer structure embodied in the structured layers, supplying the fluid whose mass flow rate is to be measured to said line sections;

electrically exciting an oscillation of said line sections;

measuring the oscillation behavior to determine said mass flow rate.

13. The method according to claim 12, wherein said structured layers are provided by anisotropic etching of a silicon wafer.

14. The method according to claim 12, wherein oscillation of the line sections is effected by electrically conductive coatings of said line sections.

15. The method according to claim 12, comprising the step of forming the spacer structure by a spacer layer, wherein the stacked structured layers that form the line section are arranged on the opposite sides of the spacer layer.

16. The method according to claim 12, wherein first and second line sections comprise a looped course and comprising the step of arranging ends of the first and second line sections in respective common bearing locations.

17. The method according to claim 16, wherein in the common bearing locations, perpendicular to the plane of symmetry, there is a further plane of symmetry, and further comprising the step of mounting relative to the further plane of symmetry third and fourth line sections in the common bearing location symmetrically with respect to the first and second line sections.

18. The method according to claim 16, wherein, the method comprises the steps of clamping and arranging tube-shaped extensions in straight fashion essentially rigidly at their ends at said bearing locations, wherein the tube-shaped extensions deform elastically if the line sections are caused to effect oscillations and merging the line sections into the tube-shaped extensions.

19. The method according to claim 12, wherein the line sections comprise first and second ends, the method comprising the step of arranging the line sections in straight fashion and mounting the first and second ends in two opposite bearing locations, respectively.

20. The method according to claim 12, comprising the step of surrounding the line sections by a hermetic encapsulation.

\* \* \* \* \*